United States Patent [19]

Holdgrafer et al.

[11] Patent Number: 4,972,311

[45] Date of Patent: Nov. 20, 1990

[54] X-Y TABLE ERROR MAPPING APPARATUS AND METHOD

[75] Inventors: William J. Holdgrafer, Burlington; Douglas L. Gauntt, Mickleton, both of N.J.; Robert B. Newsome, Sellersville, Pa.

[73] Assignee: Kulicke and Soffa Industries Inc., Willow Grove, Pa.

[21] Appl. No.: 232,003

[22] Filed: Aug. 15, 1988

[51] Int. Cl.$^5$ .................. G01B 9/00; G06F 15/46; G06K 9/00; H04N 7/00

[52] U.S. Cl. ................ 364/167.01; 364/559; 364/474.34; 382/8; 358/101; 358/106; 358/107

[58] Field of Search ............. 364/167.01, 559, 474.34; 358/106, 107, 101; 356/400, 401; 382/8, 22

[56] References Cited

U.S. PATENT DOCUMENTS

| | | | |
|---|---|---|---|
| 4,233,625 | 11/1980 | Altman | 364/559 |
| 4,291,334 | 9/1981 | Mese et al. | 356/401 |
| 4,301,470 | 11/1981 | Pagany | 364/559 |
| 4,441,205 | 4/1984 | Berkin et al. | 382/48 |
| 4,636,968 | 1/1987 | Gotou et al. | 364/559 |
| 4,712,016 | 12/1989 | Matsumura | 364/559 |
| 4,831,549 | 5/1989 | Red et al. | 364/167.01 |
| 4,835,704 | 5/1989 | Eichelberger et al. | 364/559 |
| 4,870,288 | 9/1989 | Abuku et al. | 364/559 |

Primary Examiner—Jerry Smith
Assistant Examiner—Jim Trammell
Attorney, Agent, or Firm—John B. Sowell

[57] ABSTRACT

Apparatus and a method of correcting for repeatable positioning errors in an X-Y table is provided. An accurate mask is provided having a plurality of repetitive recognizable patterns thereon which is placed in the field of view of a pattern recognition system of a semiconductor processing machine to be calibrated. The semiconductor processing machine is programmed to perform a series of steps which steps the X-Y table to positions which are supposedly accurate relative to a fixed point. At each of the stepped points, the plurality of repetitive recognizable patterns on the mask are electronically scanned by the pattern recognition system and the deviation of the position of the pattern relative to the desired position is calculated to provide X and Y deviations from the theoretical position of the X-Y table. These deviations of points along a linear X and a linear Y axis are employed to calculate the actual deviations of other pattern points for all of the possible positions of movement along other X and Y axes.

11 Claims, 2 Drawing Sheets

X-Y TABLE ERROR MAPPING APPARATUS AND METHOD

BACKGROUND OF THE INVENTION

1. Field of the Invention

The present invention relates to X-Y tables of the type employed in the semiconductor industry to accurately position a wafer or a semiconductor device relative to a stationary tool or station.

More particularly, the present invention relates to apparatus and a method for improving the accuracy of positioning an X-Y table and for eliminating repeatable type accuracy errors.

2. Description of the Prior Art

Heretofore, X-Y tables have been employed in the semiconductor industry to position wafers while making semiconductor devices and for positioning semiconductor devices or tools during bonding and packaging processes. The most common type of X-Y table employs highly accurate sliders and stages similar to those set forth in Kulicke and Soffa Industries U.S. Pat. No. 3,046,006. The stages or slides of the X-Y table may be driven by linear motors, voice coil motors or conventional servo motors acting through accurate leads screws or other means.

It is generally recognized that prior art X-Y tables have errors or imperfections which affect the proper positioning of the top stage of an X-Y table which supports either the tool or the device to be processed. For example: (1) The slider castings may be imperfect or not square. (2) The lead screw is not accurate. (3) The lead screw and motor shaft are not axially aligned causing an off-axis sinusoidal error. (4) The sliders are warped or damaged. (5) The gibbs are warped or damaged. (6) The way bar which is employed with some X-Y tables is not rigid and flexes under high forces. The aforementioned errors are repeatable and may be detected with sophisticated test equipment such as a laser interferometer.

Prior art machine tools such as numerical controlled machine tools require high accuracy and have been calibrated at the factory where made. The errors which occur as a result of positioning a table with a long lead screw do not change in the field. This positioning error information has been incorporated into the electronic controls of the numerical control machine tools so that the X or Y linear position of the lead screw is corrected or compensated to accurately position the working platform or table of the machine tool. However, this prior art error correction method does not correct for X or Y deviations which occur as a result of the orthogonal movement.

It would be desirable to provide a simplified procedure and apparatus for detecting the X-Y table repeatable errors of semiconductor processing machines which change in the field. Further it would be desirable to provide error compensation which will only be limited by the positioning apparatus without having to provide more accurate and more expensive X-Y tables.

SUMMARY OF THE INVENTION

It is a principal object of the present invention to provide an accurate mask pattern which is employed to calibrate an X-Y table.

It is another principal object of the present invention to provide a method of calibrating or error mapping an X-Y table employing an accurate mask pattern and a pattern recognition system (PRS).

It is another principal object of the present invention to provide a rapid method of error mapping an X-Y table without calibrating all of the possible table positions.

It is another object of the present invention to establish a reference point at any place on the mask pattern for error mapping.

It is another object of the present invention to provide a method of establishing a mask pattern's rotational or theta position relative to the direction of movement of the top stage of the X-Y table.

It is a general object of the present invention to provide a plurality of error correction values, one for each eye point on the mask pattern used to calibrate the X-Y table.

According to these and other objects of the present invention, there is provided a semiconductor processing machine of the type having an X-Y table, servo motors for positioning the X and Y stages of the X-Y table, control means for controlling the servo motors and error mapping data stored in a memory and recallable from said memory when said control means direct said X-Y table to an X-Y position. Said error mapping data comprising error deviation subtracted from or added to the eye point positions closest to the X and Y position to which the X-Y table is to be positioned.

DESCRIPTION OF THE PREFERRED EMBODIMENT

Figure 1:
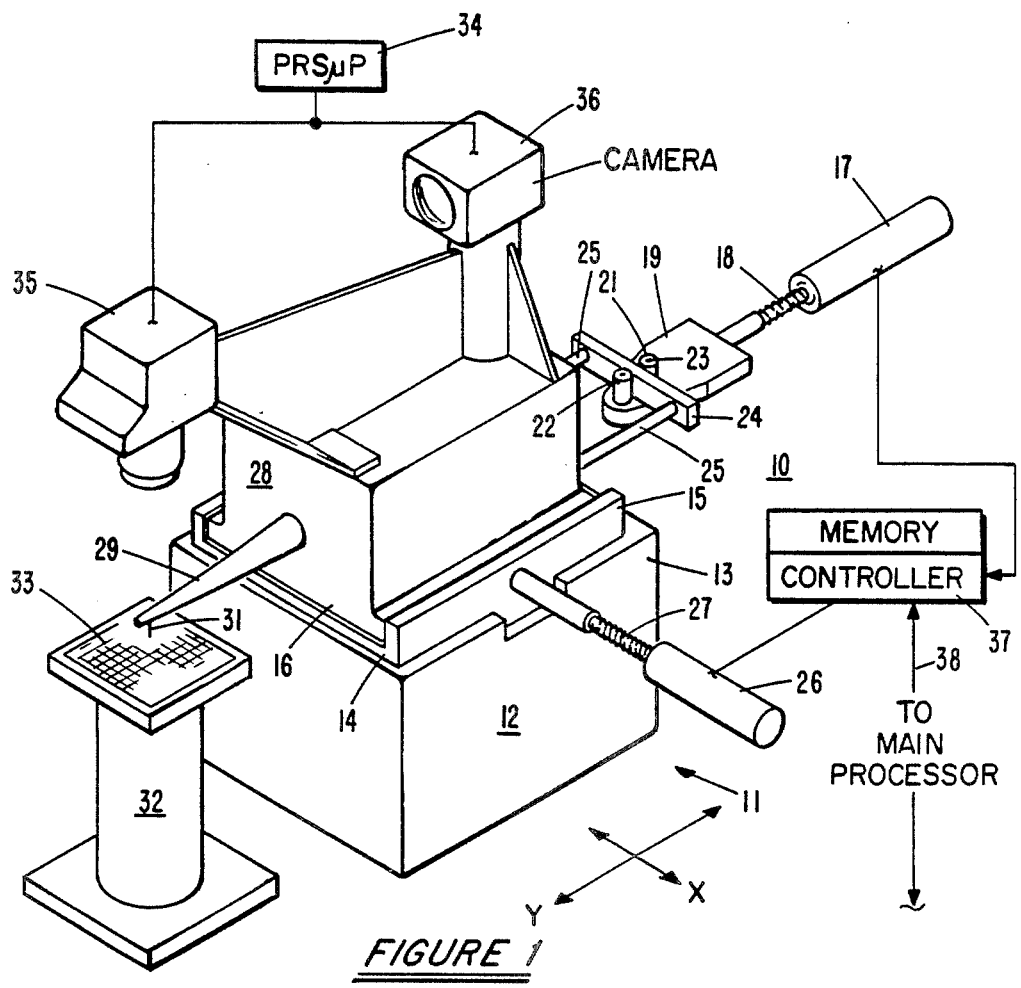
FIG. 1 is an isometric view of portions of a semiconductor processing machine showing a pattern recognition system mounted on an X-Y table opposite an accurate calibrated mask.

Refer now to FIG. 1 showing an isometric view of a preferred embodiment arrangement processing machine 10 which comprises a X-Y table 11 having a bottom stage 12 which has upward depending guides or gibbs 13. The middle stage 14 has a downward depending portion which is slidably movable in the guides 13 and is provided with upward depending guides or gibbs 15 in which the top stage 16 is movable. The middle stage 14 moves in the X direction as shown by the directional arrows and the top stage 16 moves in the Y direction as shown by direction arrows. The Y drive servo motor 17 is provided with a lead screw 18 connected to a Y stage plate 19 on which are mounted a pair of vertical bearings 21 and 22 mounted on vertical pivot pins 23. A way bar 24 is captured between the vertical bearings 21 and 22 to permit X direction movement of the way bar 24 which is connected to the top stage 16 by means of parallel supports 25. The X direction servo motor 26 is provided with a lead screw 27 which connects to the middle stage 14.

In the preferred embodiment shown schematically the bonding head holder 28 is supporting an ultrasonic transducer 29 on which is mounted a bonding capillary or bonding tool 31 positioned over a work holder 32. During the teaching or learning process an accurate mask 33 is mounted on the work holder 32 for purposes of calibrating the X-Y positional errors to be explained in more detail hereinafter. A pattern recognition system of the type shown and described in our U.S. Pat. No. 4,441,205 is mounted on the processing machine 10. The pattern recognition system comprises a microprocessor 34 interconnected to the optics 35 and a video camera 36. The optics 35 and the camera 36 are shown mounted on the bond head holder 28 for movement therewith. The X-Y servo controller 37 is shown connected to the Y servo motor 17 and the X servo motor 26 and is connected by a bus 38 to the main processor of the wire bonder (not shown). When the wire bonder's main processor commands the controller 37 to position the bonding tool 31 to an X and a Y position the commands are carried out by signals sent to the servo 17 and 26. These commands are in the form of digital signals which cause the servos to move to a predetermined position. The fact that the servo motors 17 and 26 have moved to predetermined servo positions does not insure that the bonding head holder 28 has moved to the exact X-Y position desired. It is possible to instruct the servo motors 17 and 26 to move selected predetermined X-Y values and to read or determine with the pattern recognition system 35 whether or not the correct motion has been imparted to the bonding head holder 28. Since the optics portion 35 of the pattern recognition system is capable of determining its actual position relative to the mask 33 it is possible to determine the error value at each of the selected X-Y positions to be calibrated. After the X-Y table is calibrated, the information for each of the repetitive pattern positions on mask 33 is stored in a memory associated with the controller 37 so that when the controller 37 desires to move the bonding head holder 28 to a desired X-Y position the controller 40 memory supplies the X-Y error values for more accurately positioning the bonding head holder 28 and its associated transducer 29 and bonding tool 31.

Figure 2:
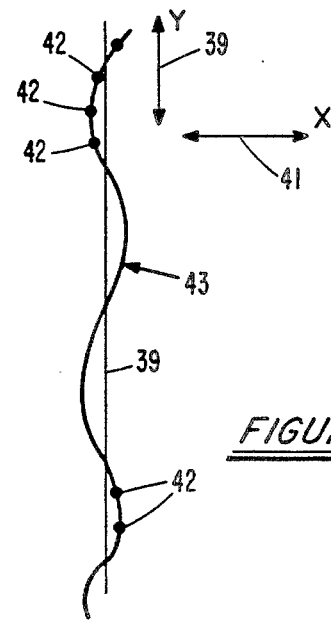
FIG. 2 is a schematic diagram of a sinusoidal movement of an X-Y table having a linear axis calibration movement superimposed thereon.

Refer now to FIG. 2 showing a schematic diagram of a sinusoidal movement which can be associated with an X-Y table. The sinusoidal movement is exaggerated for purposes of this explanation. However, assuming that the Y direction is shown by the arrow 39 it is possible to map the X direction 41 deviation at each of the actual positions 42 located by the PRS system. Since each of the actual positions 42 are representative of a position of the X-Y table, it is necessary to determine an average Y position 39 which best fits the sinusoidal curve 43. The average Y direction 39 is determined by calculating the least squares fit for each of the points 42. The Y direction 39 is a direction stored in the memory associated with the controller 37 and will be used to determine the rotational position of the mask 33 relative to the direction of movement of the top stage 16.

Figure 3:
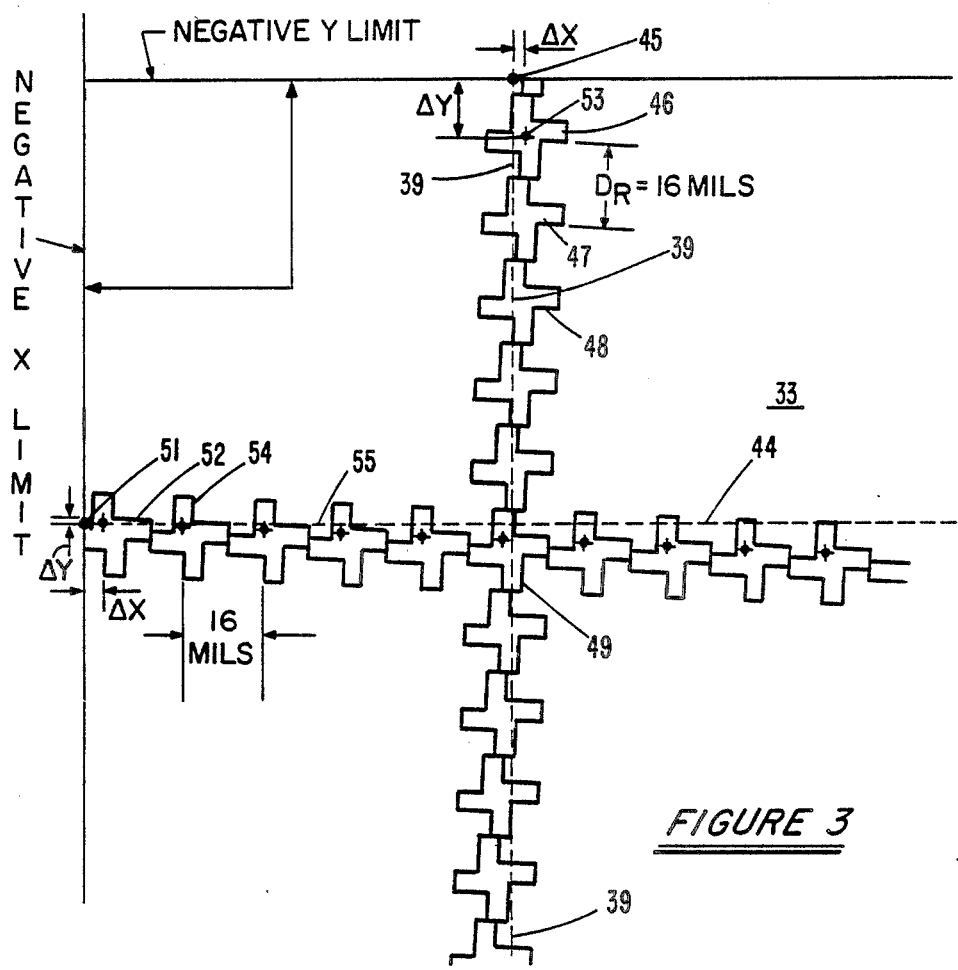
FIG. 3 is a schematic diagram showing a linear array of unique mask patterns having superimposed thereon the motion of the X-Y table for purposes of illustrating a rotational or theta correction.

Refer now to FIG. 3 showing a schematic representation of an array of discrete patterns along an X axis 44 and the theoretical true Y axis 39 described in FIG. 2. By moving the X-Y table relative to the PRS along the theoretical true Y axis, no error is being introduced because of rotation of the mask relative to the X-Y table. Thus, it will be understood that for purposes of calculating the deviation in the embodiment shown, the top stage 16 will effectively be moved along the theoretical Y axis 39. To simplify the calculations to be performed by the computer, the upper stage 16 is moved to its negative Y limit and a zero reference point 45 is established. There are other ways to establish a zero reference point. In the preferred embodiment, the zero reference point 45 is established by an electronic scanning operation performed to electronically locate the closest pattern 46 to the zero reference point 45 in terms of its delta Y and delta X deviation. In the preferred embodiment shown, the patterns 46, 47, 48, 49, etc. are repeated in identical form 16 mils apart in true X and Y accurate coordinates. Thus, by moving the top stage 16 mils and correcting for the rotational theta deviation, the pattern recognition system should be located directly over the same relative position as it scanned or observed when reading the position of pattern 46. By electronically scanning the pattern 47 in its moved position, new delta Y and delta X deviations can be calculated and these values are stored in a memory associated with the controller 37. This is the error associate with this X-Y position. In the preferred embodiment, each of the repetitive patterns 47, 48, 49, etc. are read when moved to their expected locations and the delta X and delta Y deviations are recorded for these incremental positions. Since the pattern recognition system and the X-Y table are designed for incremental movement rather than a definite linear position, the correction due to deviations of the individual patterns from their expected eye points may be recorded for each incremental position along the Y axis. As explained hereinbefore the deviations from the theoretical axis 39 will appear as a sinusoidal or serpentine path. Having recorded the deviations from the Y axis, the X-Y table is located at its negative X limit and a second zero reference point 51 is located for the negative X limit. At this point it is possible to proceed in one of two methods of calculating deviations from the eye point. In the preferred embodiment method, a new eye point is established for pattern 52. It will be noted that the central dot or eye point of the pattern 52 is not located in the geometric center of the pattern. It is possible to employ the pattern recognition system so that any reference point within the pattern may be used as the eye point. The alternative method of calculating delta X and delta Y from the X zero reference point 51 is to employ the same pattern eye point 53 as was employed with the patterns 46 to 49 in the Y axis array. In either event, the mask 33 is moved relative to the pattern recognition system 35, 36, etc. in the X direction by the servo motors 17 and 26 through distances which would desirably move the patterns 52, 54, 55, 49, etc. along predetermined distances on the X axis while making the aforementioned theta correction along the orthogonal axis 44 to the theoretical axis 39. At each of the identical patterns 52, 55, etc. new deviations from the actual position of the mask relative to the PRS are made and stored in memory. At this point in time, the mask serves no further useful purpose and may be removed and appropriately stored for future use. The only information that need be stored in the memory of the controller is information for each of the points along a serpentine axis similar to those shown with reference to FIG. 2 for each of the identical patterns along a single linear array or Y axis 39 and a single linear array of the X axis 44 even though the patterns occur throughout the full mask 33. A feature of the present invention includes the simplification of the calculation of the deviation points. For example, if the excursion of the X-Y table is designed for 1½ inches in both the X and the Y direction, this would encompass approximately 240 Y axis pattern points and 240 X axis pattern points for which deviations are observed. This information can be employed to make deviation corrections of the X-Y table for any of the 5760 distinct pattern points contained in a area 1½" by 1½". To further refine the amount of deviation which occurs at any finite point between patterns, the deviation at two adjacent patterns is employed to interpolate the deviation at points between patterns. Since the preferred embodiment pattern recognition system is capable of accurately electronically locating the resolution of a pattern to 1/20th of 1 mil (1/20,000th inch) the X-Y table can be located employing the preferred embodiment pattern recognition system to 1/10,000th of an inch with assured accuracy.

Figure 4:
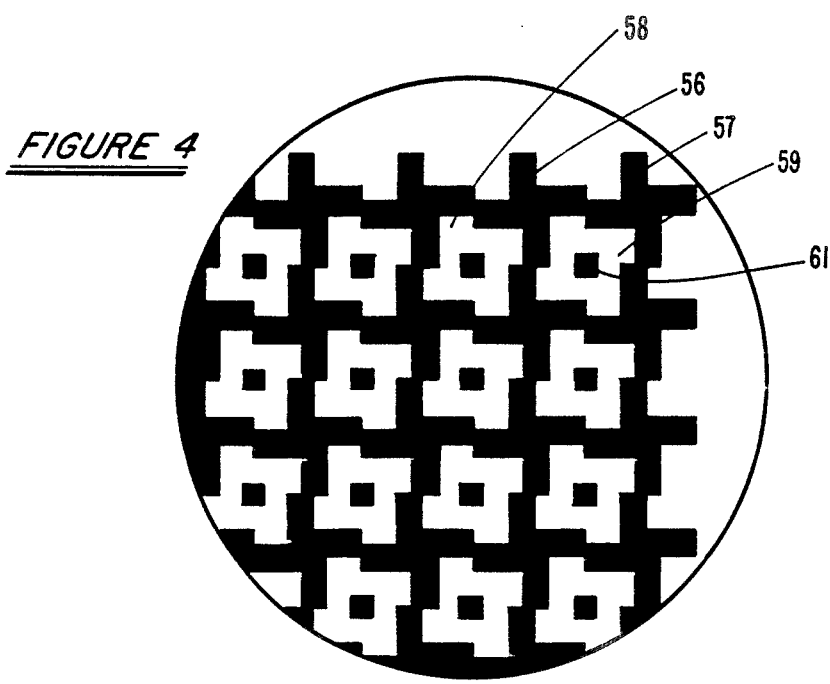
FIG. 4 is an enlarged view of a different type of repetitive mask pattern on the mask shown in FIG. 1 which is employed for error mapping.

Refer now to FIG. 4 showing an enlarged view of another form of repetitive pattern on a mask of the type shown in FIG. 1. A pattern recognition system is known to operate more efficiently when the black to white contrast ratio is approximately one to one. The unique individual patterns 56 and 57 etc. are shown in this embodiment as black opaque patterns of the type shown in FIG. 3. The white patterns 58, 59, etc. are shown having a square opaque portion 61 centered therein. A pattern of this type has been found to optimize the function of the PRS system, to prevent displacement errors and to prevent non-recognition errors which would require manual movement of the mask to re-zero and relocate a new eye point.

Having explained a preferred embodiment mask and a preferred embodiment pattern and modification thereof which is embodied in a simple glass mask of the type used in the manufacture of semiconductor wafers, it will be appreciated that the method and procedure employed in the present invention achieves the same or even better accuracy than could be achieved by transporting a car load of prior art laser interferometer test equipment and test engineers to the user site to calibrate the machine. It would be impossible to calibrate a semiconductor processing machine at the factory and have it maintain the same accuracy of calibration at the time it is installed because of changes that may occur during shipment and the fact that every machine once in use changes its positioning accuracy of its X-Y table over time. Acceptable accuracy is only expected to last six months before the X-Y table is disassembled and restored to original condition of operation during preventative maintenance. Further, it is impossible to perform calibration on one machine and use the stored deviations and calibrations on a different machine. A different processing machine with a different PRS, will generate a different pattern recognition signature and cannot use the stored signatures from another machine. Accordingly, it will be appreciated that the time required to set up the mask 33 and perform the program steps to calibrate the X-Y table movement requires less than 5 minutes, thus, recalibration need only be repeated after the aforementioned preventative maintenance has taken place.

Having explained the operation of the X-Y table and the PRS system a preferred process is as follows:

1. Remove the work holder from the work station 32 and mount the mask 33 thereon.

2. Assuming that the process steps have been previously stored in the main processor of the semiconductor bonding machine or process machine, no programming is required.

3. Initiate the table mapping algorithm and wait for approximately two to three minutes when the main processor indicates that the table mapping calibration is complete.

4. Remove the mask 33 from the work station 32 and the bonding machine or processing machine is ready to accept the product.

In summary, the menu or algorithm program which performs the steps described above first determines the angular rotation of the mask relative to the theoretical Y axis of the top stage of the X-Y table. The X-Y table is moved to a Y limit of excursion in the negative direction and a Y zero reference point 45 is determined for the actual position of the table. The table is then moved in the positive Y direction calibrating each of the points associated with the identical patterns on the mask. At the same time, the controller 37 generates a desired theoretical Y axis 39 and further generates deviation points from the theoretical Y axis. The same procedure is followed for the X axis wherein the negative X reference point 51 is located and the old eye point or a new eye point is used to map the X axis employing a theoretical X axis 44 line of movement which is orthogonal to the theoretical Y axis 39 line of movement. Thus, the deviation points so calculated are only limited by the accuracy of the mask 33 and the patterns thereon and the ability of the pattern recognition system to resolve the accuracy of location of the patterns. In the preferred embodiment the deviations are stored as a single line or array of deviation points along an X axis and along a Y axis because it has been found that other X axis deviations are substantially parallel to the axis 44 deviations calculated and have the same amount of deviation. Similarly, the deviations from other axis 39 are parallel to the theoretical Y axis 39 were found to have the same amount of deviation. This is to say that there is no inner action between the X movement and the Y movement of the X-Y table which would cause additional components of error.

The present invention has been explained employing an X-Y table of the type incorporated on a Kulicke and Soffa Industries, Inc. Model 1484 type wire bonder in which the pattern recognition system is mounted on the bonding head holder supported by the stop stage of the X-Y table. In some embodiments of processing machines, it is desirable to locate the wafer or semiconductor on the X-Y table and move the X-Y table relative to the bonding head or tool holder. The same process steps are employed to calibrate the deviation errors for the X-Y table. The present invention corrects for both X and Y deviations which result from movements in either the Y or X axis or for both axes.

What we claim is:

1. A method of correcting for repeatable positioning errors in an X-Y table, comprising the steps of:
   (a) mounting an accurate mask in the field of view of a pattern recognition system (PRS) of a semiconductor processing machine, said mask having a plurality of repetitive recognizable patterns thereon spaced from each other at predetermined accurate distances,
   (b) electronically scanning a mask pattern with said PRS to establish a reference eye point of one of said patterns,
   (c) mechanically moving said PRS relative to said mask a distance calculated to place said PRS over another adjacent identical pattern at a desired position, (d) electronically scanning said adjacent identical pattern to establish the actual position of said X-Y table relative to said desired position, (e) calculating X and Y deviations from said desired position, (f) repeating steps (b) to (e) to establish a plurality of X and Y deviation values for an X axis and for a Y axis of movement of said X-Y table along lines which traverse said mask, (g) storing the deviation values in a memory of a computer having an algorithm adapted to calculate the deviations at other X and Y positions of said X-Y table, and (h) mechanically moving said X-Y table relative to said PRS to predetermined X and Y positions, and (i) correcting the mechanical movement of said X-Y table by the calculated X and Y deviations stored in said memory of said computer to provide universal X-Y corrections.

2. A method of correcting for positioning errors as set forth in claim 1 which further includes the steps of:
moving said mask relative to said PRS from pattern to pattern in the Y direction,
electronically scanning said patterns at each pattern position,
calculating a theoretical linear Y axis of movement of said Y stage of said X-Y table to determine "a" theta rotational displacement of said mask relative to the Y stage of said X-Y table, and
compensating for said theta rotational displacement when electronically scanning said identical patterns and for establishing said plurality of deviation values.

3. A method of correcting for positioning errors as set forth in claim 2 which further includes the step of calculating said theoretical linear Y axis by calculating a least squares approximation of the X deviations from said theoretical linear Y axis.

4. A method of correcting for positioning errors as set forth in claim 1 which further includes the steps of:
positioning said mask relative to said PRS at a negative Y limit position of said X-Y table, and then
establishing a zero reference point for said Y-axis before mechanically moving said mask relative to said PRS in a positive Y direction.

5. A method of correcting for positioning errors as set forth in claim 4 which further includes the step of electronically scanning the field of view of said PRS while located at said zero reference point to determine a reference eye point relative to said zero reference point for said Y-axis.

6. A method of correcting for positioning errors as set forth in claim 5 which further includes positioning said mask relative to said PRS at a negative X limit position of said X-Y table, and then
establishing a zero reference point for said X-axis before mechanically moving said mask relative to said PRS in a positive X direction.

7. A method of correcting for positioning errors as set forth in claim 6 which further includes the step of electronically scanning said mask and the pattern adjacent to said X zero reference point for establishing a reference eye point for the X-axis.

8. A method of correcting for positioning errors as set forth in claim 6 which further includes the step of calculating the X-axis zero reference point from the pattern adjacent to said Y-axis zero reference point.

9. A method of correcting for positioning errors as set forth in claim 1 which further includes the step of interpolating the new X and Y deviations error for a desired position employing the deviation values for the two closest pattern positions.

10. A method of correcting for repeatable positioning errors which occur in movable X-Y tables comprising the steps of:
providing means for moving said X-Y table to a plurality of predetermined X and Y desired positions,
placing a highly accurate orthogonal repetitive pattern on said X-Y table covering the range of X and Y desired positions of said X-Y table,
providing a highly accurate position sensing device opposite said repetitive pattern for measuring the actual position of said pattern and said X-Y table when moved to said X and Y desired positions,
moving said patterns and said X-Y table together to a plurality of predetermined X and Y desired positions by directing said means for moving said X-Y table,
sensing the actual position of said pattern with said highly accurate position sensing device,
measuring the error between the actual position of said pattern and the expected desired position of said pattern and said X-Y table to establish the repeatable position error of each of said predetermined X and Y desired positions,
removing said repetitive pattern, and
correcting the mechanical position of said X-Y table when moved to any random desired X and Y position by employing the repeatable position error measured at the X and Y desired position adjacent to said random desired X and Y position.

11. Apparatus for correcting for repeatable positioning errors which occur in movable X-Y tables, comprising:
means for moving the top stage of said X-Y table to a plurality of predetermined X and Y desired positions,
a highly accurate pattern mounted on said top stage of said X-Y table having repetitive orthogonal indicia thereon,
position sensing means mounted opposite said repetitive pattern for measuring the actual position of said pattern and said top stage of said X-Y table,
said positioning means further including means for measuring the error between the actual position of said pattern and the expected desired position of said X-Y table to provide the repeatable position error at each of said predetermined X and Y desired positions, and
means for correcting the position of the X-Y table when moved to any random desired X and Y position by employing the repeatable position error measured at a X and Y desired position adjacent to said random X and Y position.

* * * * *